United States Patent
Zhang et al.

(10) Patent No.: US 12,360,431 B2
(45) Date of Patent: Jul. 15, 2025

(54) PHOTONIC INTEGRATED CIRCUIT WITH SQUEEZED AND ENTANGLED LIGHT GENERATION, AND ASSOCIATED METHODS

(71) Applicant: Arizona Board of Regents on Behalf of The University of Arizona, Tucson, AZ (US)

(72) Inventors: Zheshen Zhang, Tucson, AZ (US); Shuai Liu, Tucson, AZ (US); Bo-Han Wu, Tucson, AZ (US)

(73) Assignee: Arizona Board of Regents on Behalf of The University of Arizona

( * ) Notice: Subject to any disclaimer, the term of this patent is extended or adjusted under 35 U.S.C. 154(b) by 56 days.

(21) Appl. No.: 18/000,901

(22) PCT Filed: Jun. 15, 2021

(86) PCT No.: PCT/US2021/037430
§ 371 (c)(1),
(2) Date: Dec. 6, 2022

(87) PCT Pub. No.: WO2021/257561
PCT Pub. Date: Dec. 23, 2021

(65) Prior Publication Data
US 2023/0221616 A1    Jul. 13, 2023

Related U.S. Application Data

(60) Provisional application No. 63/039,094, filed on Jun. 15, 2020.

(51) Int. Cl.
G02F 1/35    (2006.01)
G02F 1/365   (2006.01)

(52) U.S. Cl.
CPC .......... G02F 1/3536 (2013.01); G02F 1/3503 (2021.01); G02F 1/365 (2013.01)

(58) Field of Classification Search
CPC ...... G02F 1/353; G02F 1/3536; G02F 1/3538; G06N 10/00; G06N 10/40; B82Y 10/00
See application file for complete search history.

(56) References Cited

U.S. PATENT DOCUMENTS 7,013,067 B2    3/2006    Ghiron et al.
8,654,801 B2    2/2014    Oto
(Continued)

OTHER PUBLICATIONS

Lvovsky, Squeezed Light, arXiv:1401.4118v2 [quant-ph] Jul. 28, 2016.
(Continued)

*Primary Examiner* — Rhonda S Peace
(74) *Attorney, Agent, or Firm* — Cozen O'Connor

(57) ABSTRACT

A photonic integrated circuit (PIC) includes a first microresonator that generates a two-mode squeezed vacuum using spontaneous four-wave mixing. Specifically, the first microresonator uses a nonlinear optical medium to convert two pump photons into a pair of entangled signal and idler photons. Due to imperfect conversion efficiency, some of the pump light may co-propagate with the signal light and idler light. To remove this "unconverted" pump light, the PIC includes a second microresonator that is tuned to resonate with only the pump light. The second microresonator is located after the first microresonator and couples the unconverted pump light into a waveguide that guide the light off the PIC. Thus, the second microresonator acts as a notch filter. Integrating this pump filter onto the PIC adds negligibly to the path length of the squeezed light, and therefore saves the propagation losses incurred when using a much larger off-chip filter.

19 Claims, 8 Drawing Sheets

(56) References Cited

U.S. PATENT DOCUMENTS

| | | | |
|---|---|---|---|
| 9,268,195 B1* | 2/2016 | Camacho | G02F 1/3536 |
| 10,031,398 B2* | 7/2018 | Matthews | G02F 1/39 |
| 2003/0235367 A1 | 12/2003 | Yamazaki | |
| 2004/0062476 A1 | 4/2004 | Jones | |
| 2004/0227089 A1 | 11/2004 | Kolodzey et al. | |
| 2013/0130254 A1 | 5/2013 | Scherer et al. | |
| 2016/0172824 A1 | 6/2016 | Song | |
| 2017/0075190 A1 | 3/2017 | Rudolph et al. | |
| 2018/0083414 A1 | 3/2018 | Weiner et al. | |
| 2021/0026223 A1* | 1/2021 | Stern | H01S 5/142 |
| 2023/0221616 A1* | 7/2023 | Zhang | G02F 1/3536 |
| | | | 385/14 |

OTHER PUBLICATIONS

Samara et al., High-Rate Photon Pairs and Sequential Time-Bin Entanglement with Si3N4 Ring Microresonators, arXiv:1902.09960v2 [quant-ph] Mar. 22, 2019.

Blumenthal et al., Silicon Nitride in Silicon Photonics, Proceedings in the IEEE, vol. 106, No. 12, Dec. 12, 2018, pp. 2209-2231.

Marino et al., Bichromatic Local Oscillator for Detection of Two-Mode Squeezed States of Light, Journal of the Optical Society of America B, Jun. 2006, arXi:quant-ph/0605230v1, May 26, 2006.

Camacho, Entangled Photon Generation Using Four-Wave Mixing in Azimuthally Symmetric Microresonators, Optics Express, vol. 20, No. 20, Sep. 24, 2012, pp. 21977-21991.

Chen et al., Frequency-Bin Entangled Comb of Photon Pairs from a Silicon-on-Insulator Micro-Resonator, Optics Express, vol. 19, No. 2, Jan. 17, 2011, pp. 1470-1483.

Vaidya et al., Broadband Quadrature-Squeezed Vacuum and Nonclassicla Photon Number Correlations from a Nanophotonic Device, arXiv:19047833v3 [quant-ph] Jan. 24, 2020.

Moss et al., New CMOS-Compatible Platforms Based on Silicon Nitride and Hydex for Nonlinear Optics, Nature Photonics, vol. 7, Aug. 2013, pp. 597-607.

MacFarlane, et al., A Multi-layer Platform for Low-Loss Nonlinear Silicon Photonics, APL Photonics 4, 110809, Nov. 22, 2019.

PCT Application No. PCT/US21/37430, International Search Report dated Sep. 23, 2021.

Magana-Loaiza et al. Multiphoton Quantum-State Engineering Using Conditional Measurements, NPJ Nature Partner Journals, Quantum Information, 2019.

* cited by examiner

PHOTONIC INTEGRATED CIRCUIT WITH SQUEEZED AND ENTANGLED LIGHT GENERATION, AND ASSOCIATED METHODS

RELATED APPLICATIONS

This application is a 35 U.S.C. § 371 filing of International Application No. PCT/US2021/037430, filed on Jun. 15, 2021, which claims priority to U.S. Provisional Patent Application No. 63/039,094, filed on Jun. 15, 2020. Each of these applications is incorporated herein by reference in its entirety.

STATEMENT REGARDING FEDERALLY SPONSORED RESEARCH OR DEVELOPMENT

This invention was made with government support under grant number 1920742 awarded by the National Science Foundation. The government has certain rights in the invention.

BACKGROUND

Squeezed light and entangled light are two types of non-classical light that exhibit quantum behavior and cannot be explained solely by classical means. In entangled light, the quantum state of one photon cannot be described independently of the quantum state of one or more other photons. When some physical properties of these photons are measured, the photons are always found to be correlated. Entangled light is used for many applications of quantum information and quantum computing, including superdense coding, quantum error correction, quantum cryptography, quantum teleportation, one-way quantum computing (e.g., via cluster states or graph states), and linear optical quantum computing.

In squeezed light, the variance of the amplitude quadrature is reduced relative to the variance of the phase quadrature (or vice versa). By comparison, coherent light (e.g., as emitted by a laser) has equally sized variances in the quadratures. Squeezing may be characterized by a squeezing factor that quantifies how much the variance of one quadrature has been reduced with respect to the vacuum state or ideal coherent light. Squeezed light can be used to improve optical interferometry by reducing measurement noise below the standard quantum limit, thereby increasing resolution and signal-to-noise. Since the reduction in noise improves with the squeezing factor, an important goal of squeezed-light systems and experiments is to obtain high squeezing factors. Other applications of squeezed light include radiometry and quantum information, including some of the applications described above for entangled light. In fact, multimode squeezed light is also entangled, and thus squeezed light and entangled light are not mutually exclusive.

One type of squeezed light is squeezed vacuum in which the average electric field is zero. Therefore, the squeezed vacuum cannot be used, by itself, to obtain a measured signal. Instead, the squeezed vacuum is inputted to one of the two input ports of an interferometer, and a bright coherent state is inputted to the other input port. Here, "bright" means an intense electric field similar to laser light. Thus, the bright coherent state generates the measured signal while the squeezed vacuum reduces the noise floor. This method of using a squeezed vacuum was originally developed to improve the sensitivity of gravitational wave detection, which is based on Michelson interferometry. However, squeezed-vacuum injection may be used to "quantum enhance" any type of optical interferometer, including Mach-Zehnder interferometers, Fabry-Perot interferometers, Sagnac interferometers, and so on. As such, applications of quantum-enhanced metrology include optical engineering, timekeeping, inertial navigation, seismology, biology, optical coherence tomography, microscopy, and others.

SUMMARY

The present embodiments feature photonic integrated circuits (PICs) that generate squeezed and entangled light, and in particular a two-mode squeezed vacuum state. PIC technology is being used to develop compact, robust platforms for squeezed and entangled light generation outside of laboratory environments. The present embodiments can therefore enable many of the applications described above.

One challenge that arises in squeezed-light devices and apparatus is that loss degrades the squeezing factor. To understand this challenge, consider squeezed light propagating through a lossy optical component. The loss can arise from any mechanism (i.e., absorption, scattering, reflection, etc.). In quantum optics, this setup can be modeled as a beamsplitter having first and second input ports and first and second output ports. The squeezed light is coupled into the first input port, the vacuum state is coupled into the second input port, a transmitted beam is coupled out of the first output port, and the lost light is coupled out of the second output port. If the inputted light is squeezed in an observable $\hat{X}$, and therefore has a variance $\langle X^2 \rangle_{in} < \frac{1}{2}$, then the transmitted light will have variance $$\langle X^2 \rangle_{out} = T \langle X^2 \rangle_{in} + (1-T)/2, \qquad (1)$$

where T is the transmissivity of the beamsplitter. In Eqn. 1, the variance of the transmitted light is increased relative to the input light due to the "mixing" in of vacuum-state noise (whose variance is $\frac{1}{2}$). Thus, the transmitted light has a larger variance than the input light, and is therefore less squeezed in this quadrature. To prevent this degradation of squeezing, it is important that T be made as close to one as possible. This is typically accomplished with anti-reflection coatings, minimizing changes in the refractive index (which create reflections), and selecting materials with low absorption and other types of loss.

The present embodiments may be advantageously used to generate squeezed light around 1550 nm, which lies within the telecom C-band. For many applications in quantum communication, squeezed light may need to travel several kilometers. To prevent excessive loss and squeezing degradation in such situations, it can be advantageous for the squeezed light to have a telecom wavelength, as then it can be transmitted over low-loss optical fibers (e.g., less than 1 dB/km) already used for telecommunications. However, the present embodiments may be used to generate squeezed light at any wavelength with appropriate choice and engineering of materials.

In the present embodiments, the PIC includes a first microresonator that generates a two-mode squeezed vacuum using spontaneous four-wave mixing. The first microresonator has a nonlinear optical medium that converts two pump photons into a pair of entangled signal and idler photons. Due to imperfect conversion efficiency, some of the pump light may co-propagate with the signal light and idler light. This "unconverted" pump light can be spectrally filtered since it has a different wavelength than the signal light and idler light. In prior-art chip-based squeezed-light generation, pump filtering is typically done off-chip with a wavelength division multiplexer or interference filter. However, such off-chip filters introduce additional losses that degrade squeezing.

The present embodiments advantageously reduce loss, and therefore preserve squeezing, by incorporating a pump filter on the PIC. Specifically, the PIC includes a second microresonator that is tuned to resonate with only the pump light (i.e., not the signal light or idler light). The second microresonator is located after the first microresonator and couples the pump light into a waveguide that brings the light off the PIC. Thus, the second microresonator essentially acts as a notch filter. Integrating this pump filter onto the PIC adds negligibly to the path length of the squeezed light, and therefore may save the propagation losses incurred when using a much larger off-chip filter. In addition, removing the off-chip filter advantageously eliminates the insertion loss incurred when coupling light into and out of an additional optical component.

In some embodiments, the PIC includes an on-chip interferometer that further reduces optical loss. In the discussion below, the on-chip interferometer is shown as a waveguide-based Mach-Zehnder interferometer. However, a different type of on-chip interferometer may be used (e.g., Michelson, Sagnac, etc.). Due to the short arm lengths of the on-chip interferometer, these embodiments may advantageously save the propagation losses incurred in larger off-chip interferometers. Similar to the off-chip filter described above, the removal of off-chip optical components can also advantageously eliminate insertion losses.

Some of the present embodiments include nano-waveguide couplers that couple the signal light and idler light off-chip (e.g., into an objective or fiber optic) with better mode-matching than conventional approaches. Advantageously, this improved mode-matching reduces loss, again helping to preserve squeezing.

DETAILED DESCRIPTION

Figure 1:
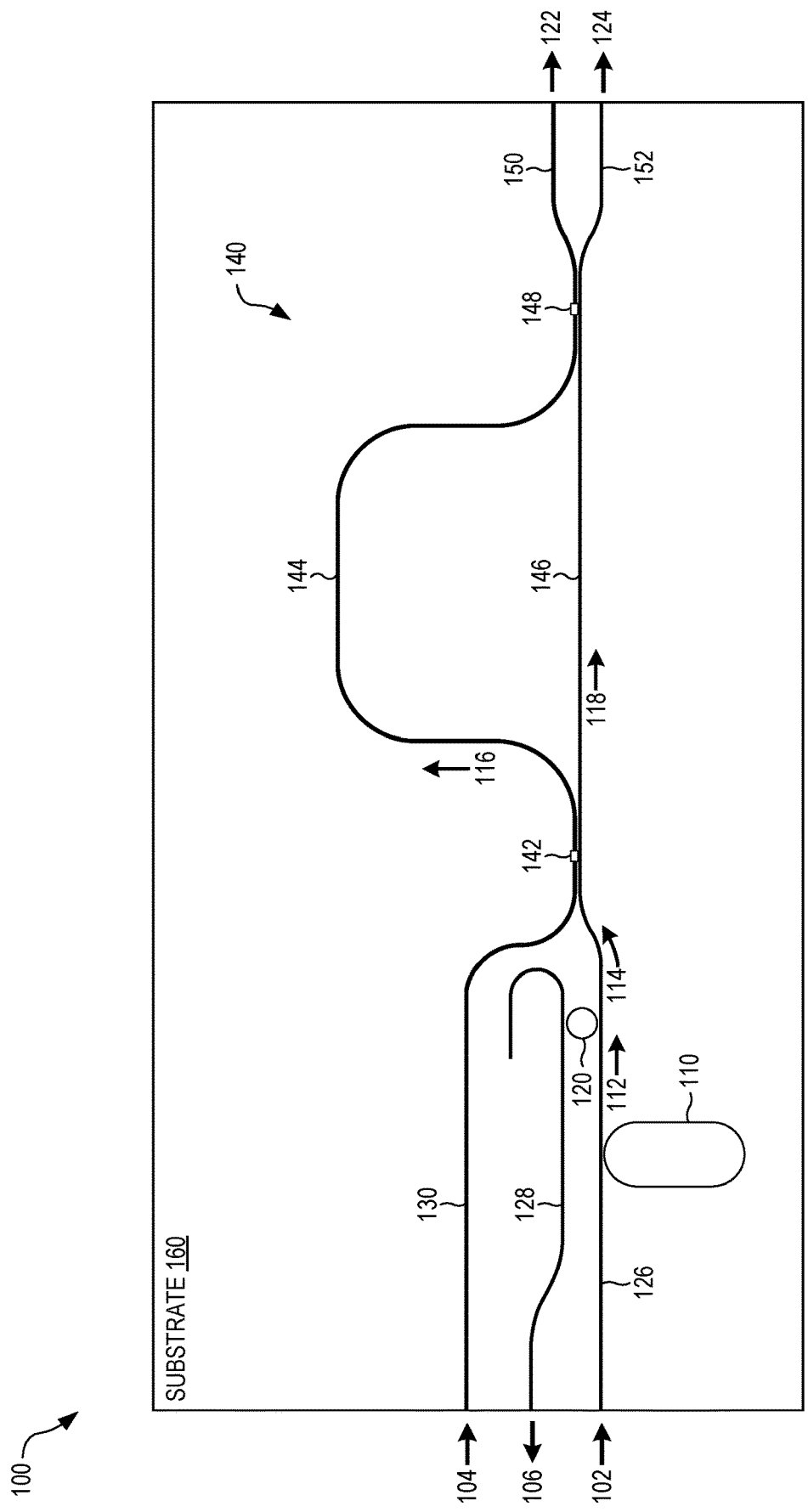
FIG. 1 is a plan view of a photonic integrated circuit (PIC) that generates entangled light, in an embodiment.

FIG. 1 is a plan view of a photonic integrated circuit (PIC) 100 that generates entangled light. Under certain conditions, as described in more detail below, the entangled light is also a two-mode squeezed vacuum state. The PIC 100 includes a first microresonator 110 and a second microresonator 120, each formed from an optical waveguide that is located on a planar substrate 160 in the shape of a loop. In FIG. 1, the first microresonator 110 is shown as a stadium (also referred to as a racetrack or quadrupolar resonator) and the second microresonator 120 is shown as a ring. However, each of the microresonators 110 and 120 may have another shape, such as a sphere, cylinder, torus, disk, square, rounded rectangle, or ellipse. Alternatively, each of the microresonators 110 and 120 may be based on distributed Bragg reflection from dielectric stacks or photonic crystals.

Figure 2:
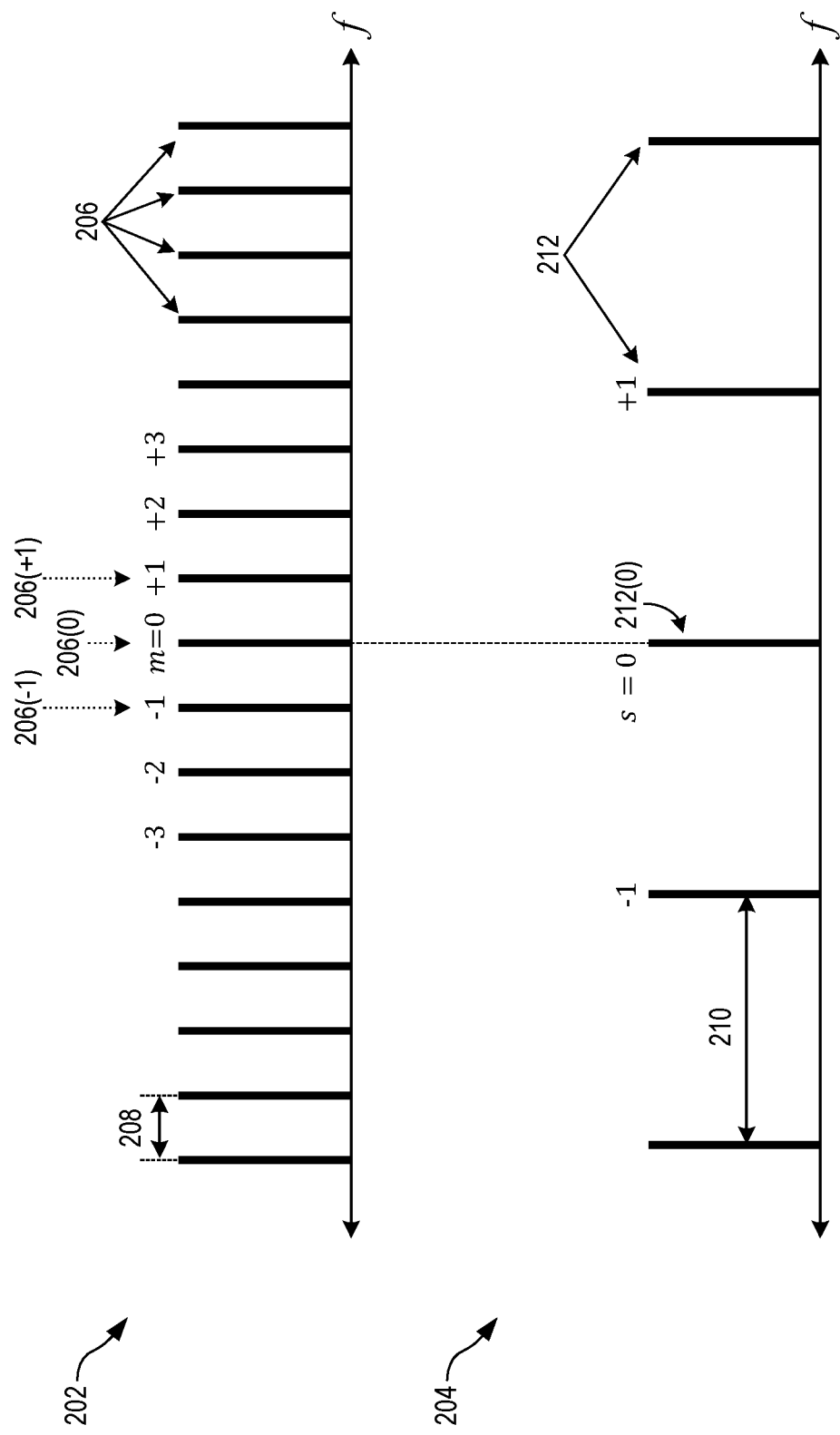
FIG. 2 shows a first frequency spectrum of a first microresonator of the PIC of FIG. 1.

FIG. 2 shows a first frequency spectrum 202 of the first microresonator 110. The first frequency spectrum 202 exhibits a comb-like structure in which optical resonances 206 are nominally separated in frequency by a first free-spectral range 208 that scales inversely with a first optical length of the first microresonator 110. Each of the optical resonances 206 may have a Q of $10^4$ or more, and is identified by a mode number m that quantifies an integer multiple of the first free-spectral range 208 between any pair of optical resonances 206. The mode numbers m are defined relative to a zeroth mode m=0.

FIG. 2 also shows a second frequency spectrum 204 of the second microresonator 120. The second frequency spectrum 204 also exhibits a comb-like structure in which optical resonances 212 are nominally separated in frequency by a second free-spectral range 210 that scales inversely with a second optical length of the second microresonator 120. Each of the optical resonances 212 may have a Q of $10^4$ or more, and is identified by a mode numbers that quantifies an integer multiple of the second free-spectral range 210 between any pair of optical resonances 212. The mode numbers s are defined relative to a zeroth mode s=0.

In the examples of FIGS. 1 and 2, the second optical length is less than the first optical length, and therefore the optical resonances 206 are spaced closer together in frequency than the optical resonances 212. As a result, the optical resonances 206 do not necessarily align with the optical resonances 212. For clarity in the following discussion, FIG. 2 shows the m=0 mode and the s=0 mode having the same frequency.

The PIC 100 also includes a first bus waveguide 126 that is located on the substrate 160 and guides pump light 102 proximate to the first microresonator 110 so that the pump light 102 is evanescently coupled into the first microresonator 110 when resonant with one of the optical resonances 206. In FIG. 2, the pump light 102 is resonant with the mode m=0, and therefore the corresponding optical resonance 206 is also referred to herein as a first pump resonance 206(0). The pump light 102 may be continuous-wave or pulsed.

The first microresonator 110 converts the pump light 102 into signal light and idler light whose average frequency equals the pump frequency. More specifically, the first microresonator 110 converts, via spontaneous four-wave mixing, two photons of the pump light 102 in the m=0 mode into a pair of time-energy-entangled signal and idler photons exciting a pair of modes +n and −n (for n≥1) whose corresponding optical resonances 206(+n) and 206(−n) are located symmetrically in frequency about the pump resonance 206(0) (or four pump photons are converted to two pairs of signal and idler photons; six pump photons are converted to three pairs of signal and idler photons, etc.). Thus, the signal and idler photons form an entangled multiphoton quantum state known as a two-mode squeezed vacuum state. For clarity in the following description, n=±1 will be used. Accordingly, the optical resonance 206 corresponding to n=−1 is also referred to herein as a signal resonance 206(−1) and the optical resonance 206 corresponding to n=+1 is also referred to herein as an idler resonance 206(+1). However, it should be recognized that the signal and idler photons may excite a different pair of modes ±n (e.g., n=2, 3, 4, etc.) corresponding to optical resonances 206(+n) and 206(−n). Furthermore, the first microresonator 110 may generate multiple signals and idlers exciting more than one pair of modes, thereby giving rise to multiple signal resonances and idler resonances.

The signal light and idler light are evanescently coupled from the first microresonator 110 into the first bus waveguide 126, combining with unconverted pump light to form composite light 112. The unconverted pump light may include pump light 102 that did not couple into the first microresonator 110 (e.g., due to imperfect coupling between the first microresonator 110 and the first bus waveguide 126) or pump light 102 that was coupled out of the first microresonator 110 before being converted into signal light and idler light.

The first bus waveguide 126 guides the composite light 112 proximate to the second microresonator 120 so that at least some of the unconverted pump light is evanescently coupled into the second microresonator 120 when resonant with one of the optical resonances 212 of the second microresonator 120. In FIG. 2, the second microresonator 120 has been tuned such that the pump light 102 is resonant with the mode s=0, and therefore the corresponding optical resonance 212(0) is also referred to herein as a second pump resonance 212(0).

The PIC 100 also includes a second bus waveguide 128 that is located on the substrate 160 and configured to guide the unconverted pump light. The second bus waveguide 128 passes proximate to the second microresonator 120 to evanescently couple the unconverted pump light from the second microresonator 120 into the second bus waveguide 128. The second bus waveguide 128 then guides the unconverted pump light as rejected light 106 that is coupled off of the substrate 160. The rejected light 106 may be detected (e.g., with a photodetector) and used to phase-lock the pump frequency or the resonant frequency of the microresonator 110 such that the pump light 102 is resonant with the first pump resonance 206(0) and/or the second pump resonance 206(2). Moreover, this filtering procedure can be duplicated multiple times to further suppress the pump light.

In FIG. 2, the signal light and idler light are not resonant with any of the optical resonances 212. Thus, the signal light and idler light are not efficiently coupled into the second microresonator 120 and do not contribute to the rejected light 106. Equivalently, the second microresonator 120 acts as a notch filter that selectively filters the unconverted pump light from the composite light 112. Past the second microresonator 120, the first bus waveguide 126 guides filtered light 114 that is primarily the signal light and idler light. Due to imperfect coupling with the second microresonator 120, some residual pump light may still be present in the filtered light 114. Nevertheless, the power of this residual pump light is much less than it would be without the filtering by the second microresonator 120.

In FIG. 1, a first physical length of the first microresonator 110 is greater than a second physical length of the second microresonator 120. Thus, the first free-spectral range 208 is less than the second free-spectral range 210, as shown in FIG. 2. For example, the first physical length may be ten times greater than the second physical length, in which case the first free-spectral range 208 is approximately ten times smaller than the second free-spectral range 210. A second free-spectral range 210 that is larger than the first free-spectral range 210 may help minimize unwanted coupling of the signal light and idler light into the second microresonator 120 by ensuring that the second pump resonance 212(0) is the one optical resonance 212 closest in frequency to the signal light and idler light. That is, keeping all other optical resonances 212 far detuned from the signal and idler frequencies prevents coupling of the signal and idler light into the second microresonator 120.

Figure 3:
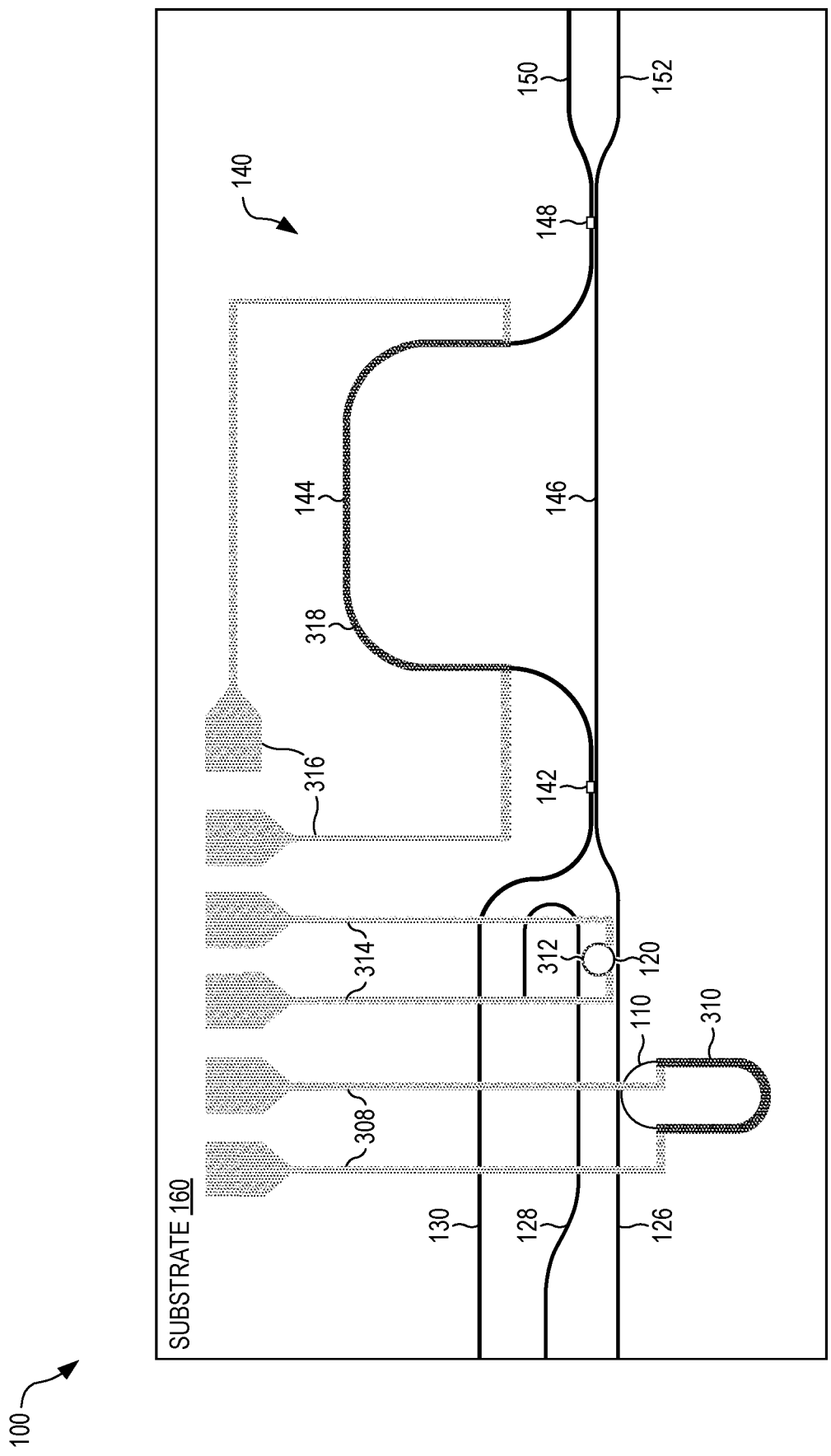
FIG. 3 shows a first microheater used to change the optical length of the first microresonator of the PIC of FIG. 1, in an embodiment.

FIG. 3 shows a first microheater 310 used to change the optical length of the first microresonator 110, and a second microheater 312 used to change the optical length of the second microresonator 120. The first microheater 310 covers at least a portion of the first microresonator 110. When driven with an electrical current via electrical traces 308, the first microheater 310 generates heat that changes the physical length of the first microresonator 110. This change in physical length changes the optical length, in turn decreasing the first free-spectral range 208 and shifting the frequencies of the optical resonances 206. The heat may also change the refractive index of the material forming the first microresonator 110, which also changes the optical length. Thus, by changing the amount of heat generated, the first microresonator 110 can be tuned such that the first pump resonance 206(0) remains resonant with the pump light 102. This maximizes coupling of the pump light 102 into the first microresonator 110, in turn maximizing the amount of signal light and idler light that is generated.

The second microheater 312 operates similarly to the first microheater 310 except that it covers at least a portion of the second microresonator 120. When the second microheater 312 is driven with an electrical current via electrical traces 314, the resulting heat changes the refractive index of the second microresonator 120, in turn shifting the optical resonances 212. Thus, by changing the amount of heat generated, the second microresonator 120 can be tuned and stabilized such that the second pump resonance 206(0) remains resonant with the pump light 102. This maximizes coupling of the unconverted pump light out of the first bus waveguide 126, resulting in filtered light 118 containing a minimum amount of residual pump light.

In some embodiments, the PIC 100 includes a waveguide-based interferometer that is located on the substrate 160. The interferometer may be used to characterize the signal light and idler light using local-oscillator light 104 (e.g., to measure the squeezing factor of the signal light and idler light). As compared to characterizing the signal light and idler light using an off-chip interferometer, incorporating the interferometer on the substrate 160 increases transmission therethrough, thereby preventing degradation of the squeezing factor. In FIG. 1, the interferometer 140 is shown as a Mach-Zehnder interferometer 140 that receives the local-oscillator light 104 and the filtered light 114, and generates first interferometer output light 122 and second interferometer output light 124. The Mach-Zehnder interferometer 140 has a first waveguide beamsplitter 142, a second waveguide beamsplitter 148, a first interferometer-arm waveguide 144 that guides first interferometer light 116 from a first output port of the first beamsplitter 142 to a first input port of the second beamsplitter 148, and a second interferometer-arm waveguide 146 that guides second interferometer light 118 from a second output port of the first beamsplitter 142 to a second input port of the second beamsplitter 148. A local-oscillator waveguide 130 guides the local-oscillator light 104 on-chip to a first input port of the first beamsplitter 142, and the first bus waveguide 126 guides the filtered light 114 to a second input port of the first beamsplitter 142. A first interferometer output waveguide 150 guides the first interferometer output light 122 out of a first output port of the second beamsplitter 148, and a second interferometer output waveguide 152 guides the second interferometer output light 152 out of a second output port of the second beamsplitter 148. The local-oscillator light 104 may be monochromatic or bichromatic. For example, one monochromatic local oscillator can address the signal or the idler light and thus two monochromatic local oscillators may be used to measure the entangled degree of freedom. Bichromatic local-oscillator light simultaneously addresses the signal and the idler light and can therefore be used to measure the squeezing. The PIC 100 may alternatively have a different type of interferometer used to characterize squeezed light without departing from the scope hereof.

FIG. 3 also shows a third microheater 318 used to change the optical length of the first interferometer-arm waveguide 144. By controlling the relative difference in optical path lengths between the first interferometer-arm waveguide 144 and the second interferometer-arm waveguide 146, the third microheater 318 can be used to select the measurement phase of the Mach-Zehnder interferometer 140, and thus the overall splitting ratio of the Mach-Zehnder interferometer 140 to enable high interference visibility between the squeezed light and the local oscillator. The third microheater 318 covers at least a portion of the first interferometer-arm waveguide 144 and can be driven via electrical traces 316 to generate heat that changes the refractive index of the first interferometer-arm waveguide 144. The third microheater 318 may be alternatively located to cover at least a portion of the second interferometer-arm waveguide 146 (and none of the first interferometer-arm waveguide 146). Alternatively, two separate microheaters (and corresponding electrical traces) may be used to independently control the optical lengths of the first interferometer-arm waveguide 144 and second interferometer-arm waveguide 146.

Those trained in the art will recognize that due to dispersion of the optical material forming the first microresonator 110, the optical resonances 206 may not be exactly equally spaced by the first free-spectral range 208. The nonuniformity in the frequency spacing may be quantified by a frequency mismatch $\Delta = 2\omega_p - \omega_S - \omega_I$, where $\omega_p$ is the frequency of the first pump resonance 206(0), $\omega_S$ is the frequency of the signal resonance 206(−1), and $\omega_I$ is the frequency of the idler resonance 206(+1). To enhance generation of the signal light and idler light, the frequency mismatch $\Delta$ should be less than a linewidth of the microresonator 110 (e.g., a half-width at half maximum of the first pump resonance 206(0)). The frequency mismatch can be engineered by designing the geometry of the microresonator 110 and partially compensated by nonlinear optical effect such as cross-phase modulation.

Figure 4:
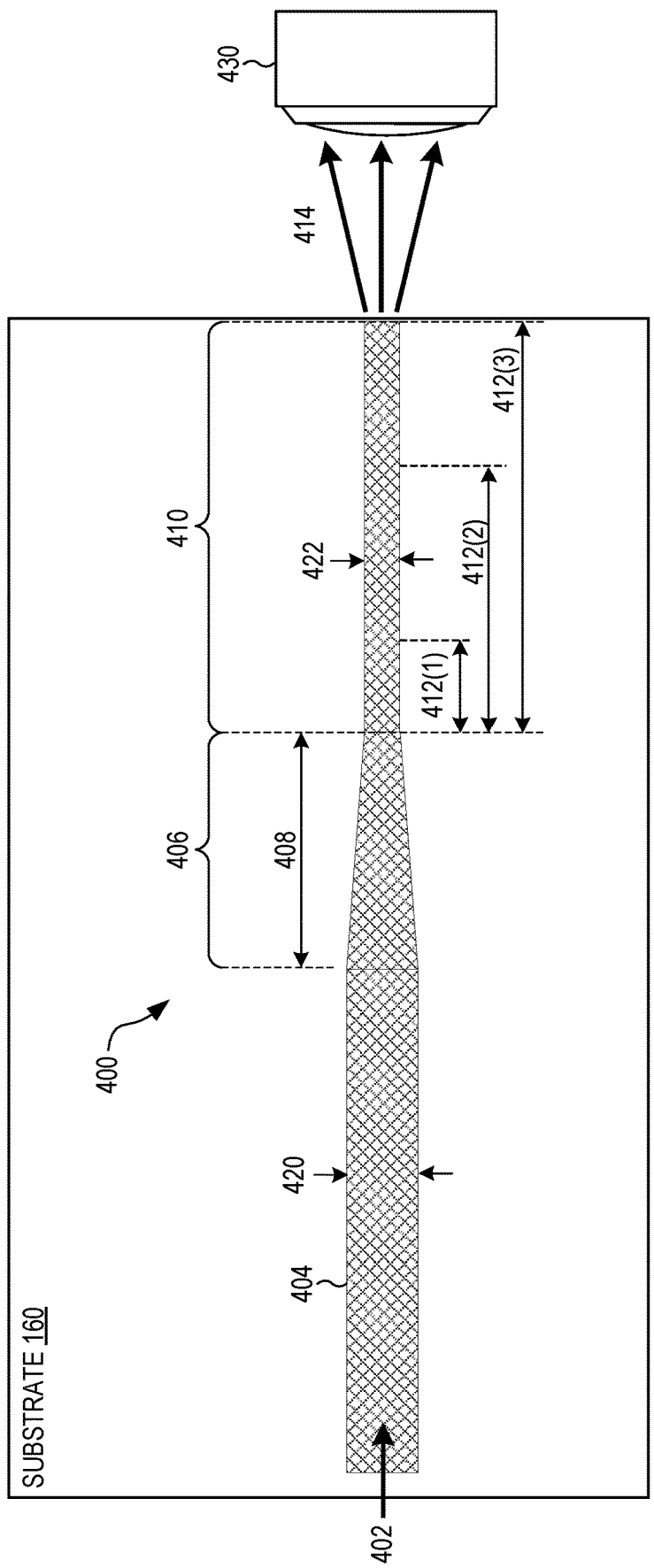
FIG. 4 is a plan view of a nano-waveguide coupler that may be used to increase the efficiency with which guided light is coupled off of the substrate of the PIC of FIG. 1, in an embodiment.

FIG. 4 is a plan view of a nano-waveguide coupler 400 that may be used with the PIC 100 to increase the efficiency with which guided light 402 is coupled off of the substrate 160. The nano-waveguide coupler 400 is located on the substrate 160 and optically interfaced with a bus waveguide 404 (e.g., the first interferometer output waveguide 150, the second interferometer output waveguide 152, or the first bus waveguide 126 after the second microresonator 120) along which guided light 402 propagates. The nano-waveguide coupler 400 includes a tapered section 406 with a length 408 that transitions between a width 420 of the bus waveguide 404 and a width 422 of an output section 410. The term "nano-waveguide" indicates that the width 422 is less than one-half of the wavelength of the guided light 402.

Due to the small size of the width 422, propagation of guided light 402 through the output section 410 may result in higher propagation loss as compared to propagation through the bus waveguide 404. In this case, a length 412 of the output section 410 may be selected to be relatively short to minimize this loss. For example, FIG. 4 indicates a first length 412(1) that is shorter than, and therefore less lossy than, a second length 412(2). Similarly, the second length 412(2) is shorter than, and therefore less lossy than, a third length 412(3). The guided light 402 then couples out of the output section 410 to become free-space light 414.

The width 422 advantageously confines the guided light 402 in a mode of the output section 410 that improves mode-matching (i.e., coupling efficiency) to a subsequent optic 430 (e.g., an objective lens or cleaved face of an optical fiber), as compared to mode-matching directly from the bus waveguide 404. Coupling efficiencies greater than 90% have been reported. The tapered section 406 slowly transitions the guided light 402 between the width 420 and the width 422, minimizing losses due to mode mismatches between the bus waveguide 404 and the output section 410 that can degrade the squeezing factor of the signal light and idler light.

The first interferometer output waveguide 150 may use one nano-waveguide coupler 400 to couple the first interferometer output light 122 off of the substrate 160. Similarly, the second interferometer output waveguide 152 may use a second nano-waveguide coupler 400 to couple the second interferometer output light 124 off of the substrate 160. Each of the interferometer output lights 122 and 124 may be detected (e.g., with a photodetector) to implement direct photon counting, a balanced homodyne measurement, or a heterodyne measurement.

While FIG. 4 shows the nano-waveguide coupler 400 being used to couple guided light 402 off of the substrate 160, the nano-waveguide coupler 400 may also be used in reverse to couple free-space light 414 onto the substrate 160.

The PIC 100 may be fabricated using any materials used for chip-based photonics, such as crystalline silicon, silicon nitride (SiN), silica ($SiO_2$), silicon on insulator, lithium niobate ($LiNbO_3$), calcium fluoride (CaF), gallium arsenide (GaAs), aluminum gallium arsenide (AlGaAs), gallium nitride (GaN), glass (e.g., Hydex), and so on. One advantage of silicon nitride over silicon is that it is exhibits less loss at telecom wavelengths, and therefore may be used to fabricate the PIC 100 for operation with standard telecommunications components (e.g., fiber patch cords). Silicon nitride is also transparent into the visible, whereas crystalline silicon becomes opaque at wavelengths shorter than 1300 nm due to its bandgap energy at 1.1 eV.

Figure 5:
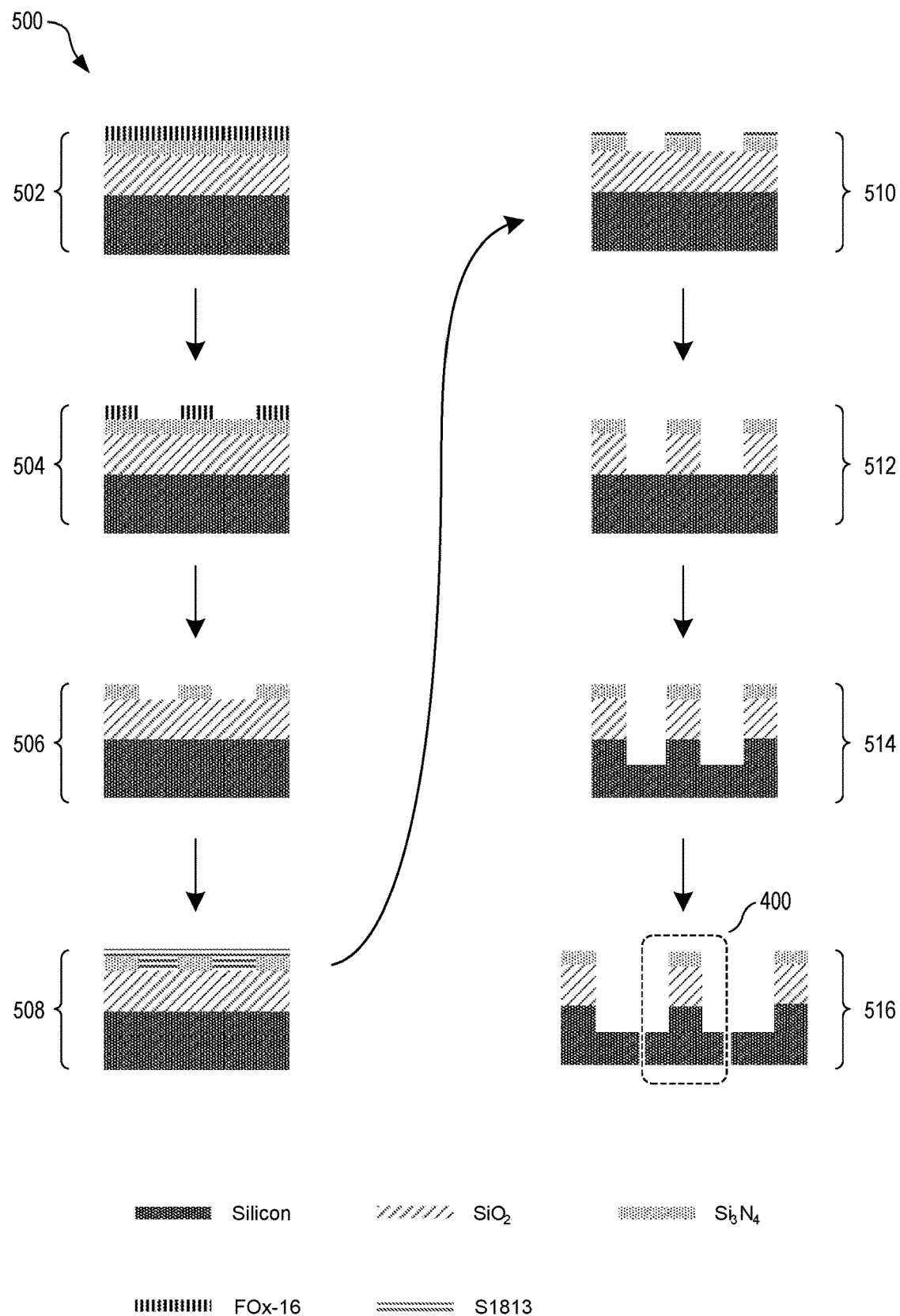
FIG. 5 illustrates a method for fabricating the nano-waveguide coupler of FIG. 4, in embodiments.

FIG. 5 illustrates a method 500 for fabricating the nano-waveguide coupler 400 using a silicon-nitride-on-insulator (SNOI) process. A SNOI wafer has a bottom layer of silicon (Si), a middle layer of silicon oxide ($SiO_2$), and a top layer of silicon nitride ($Si_3N_4$). In step 502, a negative resist layer is spin-coated on top of the silicon nitride layer. The negative resist layer may be FOx-16, as indicated in FIG. 5, or a similar type of resist coating. In step 504, the negative resist layer is patterned using e-beam lithography. In step 506, the silicon nitride layer is patterned via dry etching (e.g., via inductive coupled plasma reactive ion etching). In step 508, a photoresist layer is spin-coated on top of the patterned silicon nitride layer. The second resist layer may be S1813, as indicated in FIG. 5, or a similar type of photoresist material. In step 510, the photoresist layer is processed via photolithography. In step 512, the silicon oxide is patterned via dry etching (e.g., inductive coupled plasma reactive ion etching). In step 514, the silicon layer is wet etched to thin the silicon layer. In step 516, the resulting structure is diced at the thinned regions of the silicon layer to obtain individual nano-waveguide couplers 400.

Figure 6:
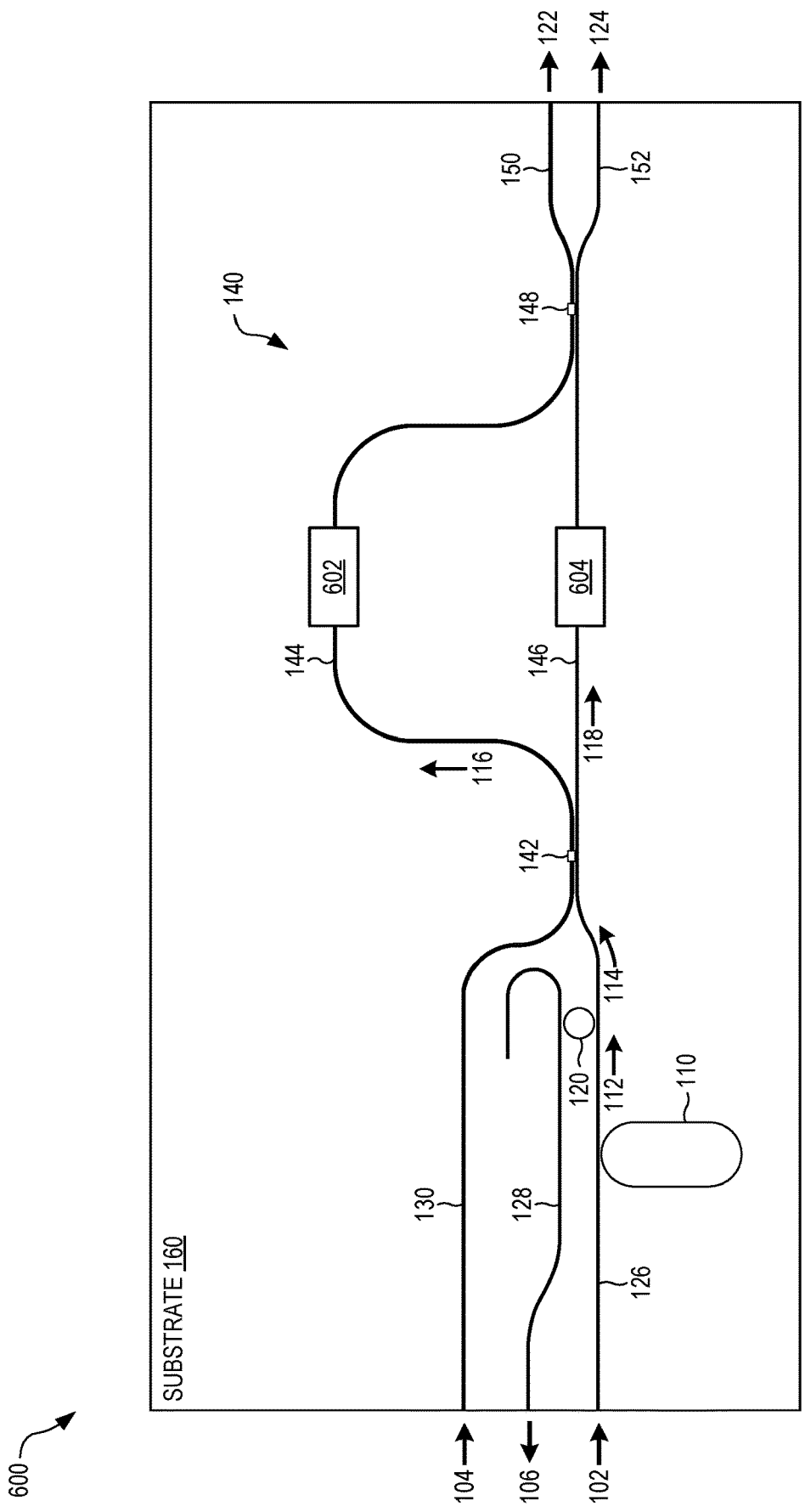
FIG. 6 is a plan view of a PIC that is similar to the PIC of FIG. 1 except that a first sensor is coupled to the first interferometer-arm waveguide and a second sensor is coupled to the second interferometer-arm waveguide, in an embodiment.

FIG. 6 is a plan view of a PIC 600 that is similar to the PIC 100 of FIGS. 1 and 3 except that a first sensor 602 is coupled to the first interferometer-arm waveguide 144, and a second sensor 604 is coupled to the second interferometer-arm waveguide 146. The local-oscillator light 104 is bichromatic, i.e., having two phase-coherent frequency components, where one of the frequency components is close to the signal frequency and the other frequency component is close to the idler frequency. Each of the sensors 602 and 604 is a transducer that couples one physical domain to the optical domain. For example, each of the first sensor 602 and second sensor 604 may be a thermal heater that converts temperature into refractive index shifts of the interferometer-arm waveguides 144 and 146, respectively. Alternatively, each of the sensors 602 and 604 may be an electro-optic transducer that converts an RF/microwave signal into optical modulation, or an opto-mechanical transducer that converts mechanical displacements into refractive index shifts. In any case, the effect of the sensors 602 and 604 gives rise to a phase shift that can be detected by the Mach-Zehnder interferometer 140. In some embodiments, the PIC 600 includes only one of the first sensor 602 and second sensor 604.

Figure 7:
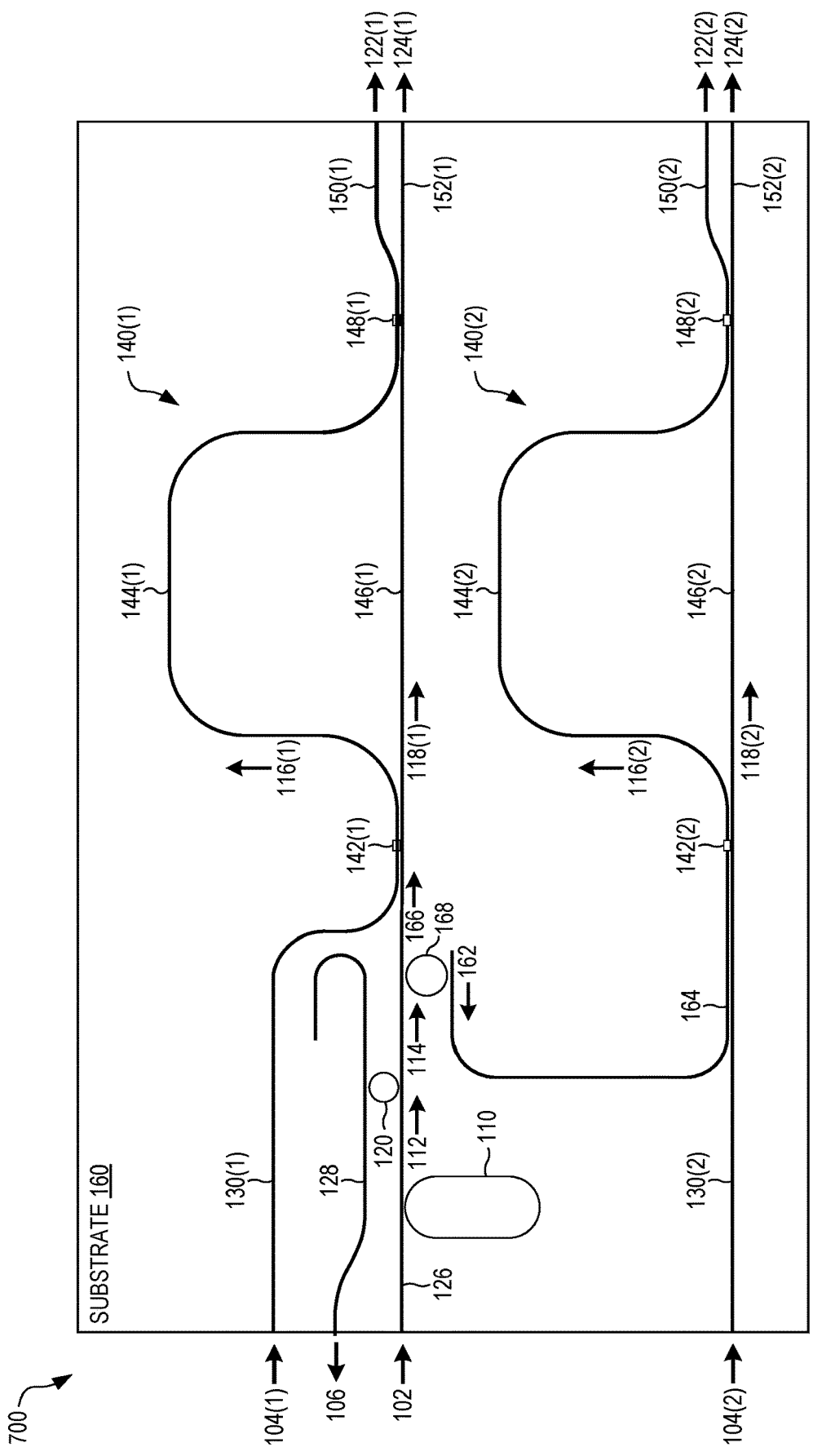
FIG. 7 is a plan view of a PIC that is similar to the PIC of FIG. 1 except that it includes two Mach-Zehnder interferometers, in an embodiment.

FIG. 7 is a plan view of a PIC 700 that is similar to the PIC 100 of FIGS. 1 and 3 except that it includes two Mach-Zehnder interferometers 140(1) and 140(2), one for signal light and one for idler light. The PIC 700 uses two monochromatic local oscillators 104(1) and 104(2), one having a frequency close to the signal frequency and the other having a frequency close to the idler frequency. Advantageously, the two monochromatic local oscillators 104(1), 104(2) and two Mach-Zehnder interferometers 140(1), 140(2) can be used to fully characterize the two-mode squeezed state generated by the first microresonator 110.

In FIG. 7, a third microresonator 168 is tuned to resonate with only the signal (i.e., not the idler), thereby coupling signal light 162 from the first bus waveguide 126 into a signal waveguide 164 that guides the signal light 162 into a signal Mach-Zehnder interferometer 140(2). After the third microresonator 168, only idler light 166 propagates along the first bus waveguide 126 into an idler Mach-Zehnder interferometer 140(1). A first local-oscillator waveguide 130(1) guides monochromatic local-oscillator light 104(1) into the idler Mach-Zehnder interferometer 140(1), and a second local-oscillator waveguide 130(2) guides monochromatic local-oscillator light 104(2) into the signal Mach-Zehnder interferometer 140(2). The third microresonator 168 may be alternatively tuned to resonate with only the idler (i.e., not the signal) so that the Mach-Zehnder interferometer 140(1) characterizes the signal light 162 and the Mach-Zehnder interferometer 140(2) characterizes the idler light 166.

Figure 8:
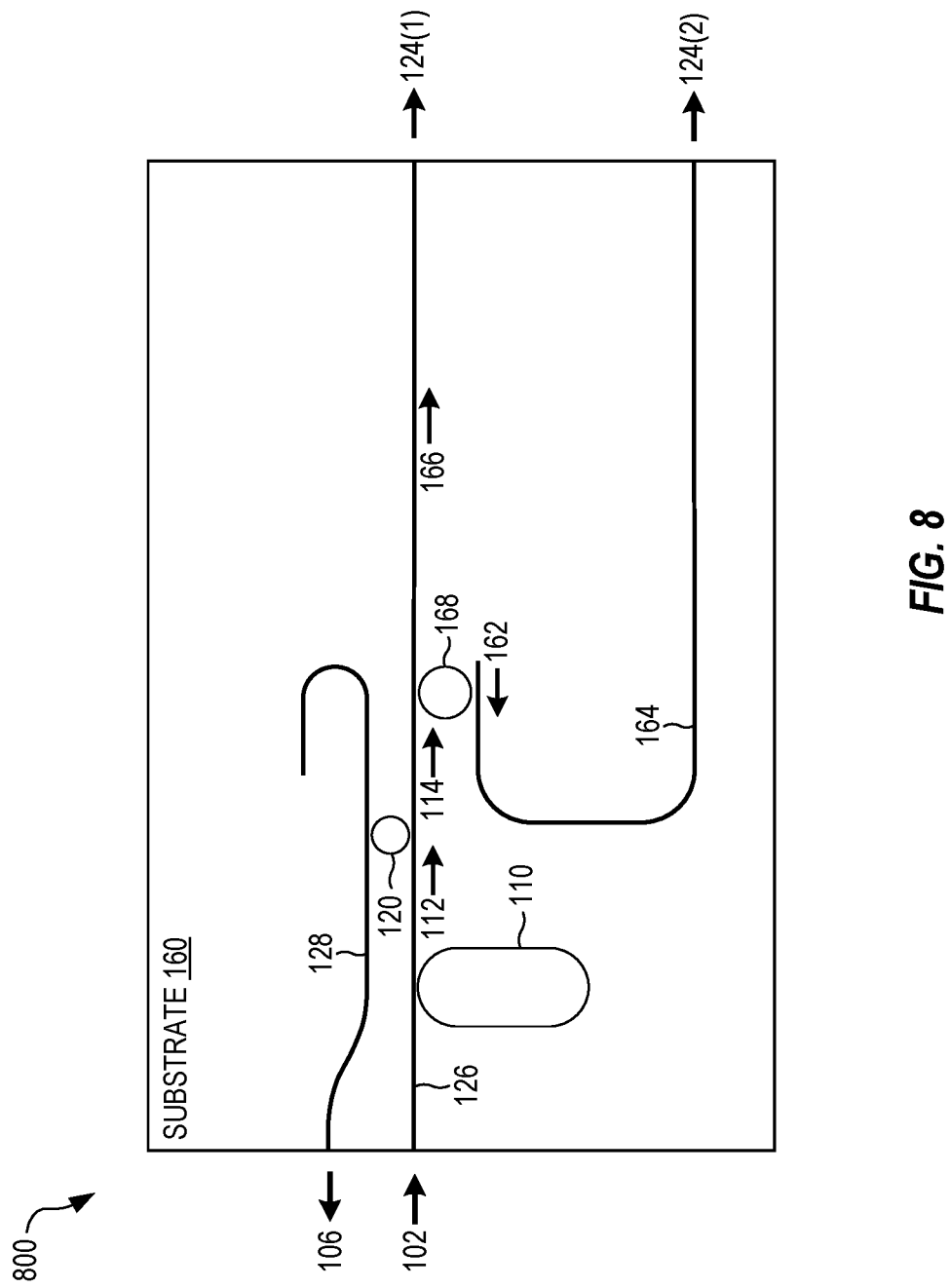
FIG. 8 is a plan view of a PIC that is similar to the PIC of FIG. 7 except that it excludes the Mach-Zehnder interferometers, in an embodiment.

FIG. 8 is a plan view of a PIC 800 that is similar to the PIC 700 of FIG. 7 except that it excludes the Mach-Zehnder interferometers 140(1) and 140(2). In the example of FIG. 8, the signal light 162 and idler light 166 are shown being coupled off-chip so that their entanglement can be used with other off-chip devices. Alternatively, the signal light 162 and idler light 166 may be guided on-chip to other devices that use the entanglement to implement additional functionality.

Combination of Features

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) A PIC includes a first microresonator and a first bus waveguide that evanescently couples pump light from the first bus waveguide into the first microresonator. The first bus waveguide also evanescently couples signal light and idler light from the first microresonator into the first bus waveguide. The PIC also includes a second bus waveguide and a second microresonator that resonantly couples unconverted pump light from the first bus waveguide to the second bus waveguide.

(A2) In the PIC denoted (A1), the first microresonator resonantly converts the pump light into the signal light and idler light.

(A3) In either of the PICs denoted (A1) and (A2), the second microresonator non-resonantly couples each of the signal light and idler light from the first bus waveguide to the second bus waveguide.

(A4) In any one of the PICs denoted (A1) to (A3), the first bus waveguide guides the pump light, the signal light, and the idler light.

(A5) In any one of the PICs denoted (A1) to (A4), the second bus waveguide guides the pump light.

(A6) In any one of the PICs denoted (A1) to (A5), each of the first microresonator, the first bus waveguide, the second bus waveguide, and the second microresonator is located on a planar substrate.

(A7) In any one of the PICs denoted (A1) to (A6), each of the first and second microresonators is shaped as either a ring or a stadium.

(A8) In any one of the PICs denoted (A1) to (A7), a length of the second microresonator is less than a length of the first microresonator.

(A9) In any one of the PICs denoted (A1) to (A8), the first microresonator is fabricated from a material such that the first microresonator resonantly converts the pump light into the signal light and idler light via spontaneous four-wave mixing.

(A10) In the PIC denoted (A9), the material is silicon nitride or silicon.

(A11) In any one of the PICs denoted (A1) to (A10), the PIC further includes a nano-waveguide coupler optically interfacing with the first bus waveguide.

(A12) In the PIC denoted (A11), the nano-waveguide coupler includes a tapered section.

(A13) In either one of the PICs denoted (A11) and (A12), the PIC further includes a first microheater located proximate to the first microresonator and a second microheater located proximate to the second microresonator.

(A14) In any one of the PICs denoted (A1) to (A13), the PIC further includes a local-oscillator waveguide and a waveguide-based Mach-Zehnder interferometer coupled with the local-oscillator waveguide, the first bus waveguide, a first interferometer output waveguide, and a second interferometer output waveguide.

(A15) In the PIC denoted (A14), the PIC further includes a first nano-waveguide coupler optically interfacing with the first interferometer output waveguide and a second nano-waveguide coupler optically interfacing with the second interferometer output waveguide.

(A16) In the PIC denoted (A15), each of the first and second nano-waveguide couplers includes a tapered section.

(A17) In either one of the PICs denoted (A15) and (A16), the waveguide-based Mach-Zehnder interferometer includes first and second waveguide beamsplitters and first and second interferometer-arm waveguides that couple between the first and second waveguide beamsplitters. Furthermore, the local-oscillator waveguide and the first bus waveguide are coupled to the first waveguide beamsplitter, and the first and second interferometer output waveguides are coupled to the second waveguide beamsplitter.

(A18) In the PIC denoted (A17), the PIC further includes an interferometer microheater located proximate to the first interferometer-arm waveguide.

(B1) A method for generating squeezed light includes evanescently coupling pump light from a first bus waveguide into a first microresonator and resonantly converting, within the first microresonator, the pump light into entangled signal light and idler light. The method also includes evanescently coupling the signal light and idler light from the first microresonator into the first bus waveguide and resonantly coupling, with a second microresonator, unconverted pump light from the first bus waveguide into a second bus waveguide.

(B2) In the method denoted (B1), the entangled signal light and idler light form a two-mode squeezed vacuum state.

(B3) In either one of the methods denoted (B1) and (B2), the method also includes coupling the signal light and idler light from the first bus waveguide into free space.

(B4) In the method denoted (B3), said coupling uses a nano-waveguide coupler optically interfacing with the first bus waveguide.

(B5) In any one of the methods denoted (B1) to (B4), the method further includes coupling the unconverted pump light from the second bus waveguide into free space.

(B6) In any one of the methods denoted (B1) to (B5), the method further includes changing a frequency of the pump light such that the pump light is resonant with one of a plurality of resonances of the first microresonator.

(B7) In any one of the methods denoted (B1) to (B6), the method further includes changing an optical length of the first microresonator such that one of a plurality of resonances of the first microresonator is resonant with the pump light. The method further includes changing an optical length of the second microresonator such that one of a plurality of resonances of the second microresonator is resonant with the pump light and none of the plurality of resonances of the second microresonator is resonant with the signal light or the idler light.

(B8) In the method denoted (B7), said changing the optical length of the first microresonator includes driving a first microheater proximate to the first microresonator to heat the first microresonator and said changing the optical length of the second microresonator includes driving a second microheater proximate to the second microresonator to heat the second microresonator.

(B9) In any one of the methods denoted (B1) to (B8), the method further includes coupling the signal light and idler light from the first bus waveguide into a waveguide-based Mach-Zehnder interferometer, coupling local-oscillator light into the waveguide-based Mach-Zehnder interferometer from a local-oscillator waveguide, coupling first output light from the waveguide-based Mach-Zehnder interferometer into a first interferometer output waveguide, and coupling second output light from the waveguide-based Mach-Zehnder interferometer into a second interferometer output waveguide.

(B10) In the method denoted (B9), the method further includes coupling the local-oscillator light from free space into the local-oscillator waveguide.

(B11) In either one of the methods denoted (B9) and (B10), the local-oscillator light is either monochromatic or bichromatic.

(B12) In any one of the methods denoted (B9) to (B11), the method further includes coupling the first output light from the first interferometer output waveguide into free space and coupling the second output light from the second interferometer output waveguide into free space.

(B13) In the method denoted (B12), said coupling the first output light uses a first nano-waveguide coupler optically interfacing with the first interferometer output waveguide and said coupling the second output light uses a second nano-waveguide coupler optically interfacing with the second interferometer output waveguide.

(B14) In either one of the methods denoted (B12) and (B13), the method further includes detecting the first output light and the second output light.

(B15) In any one of the methods denoted (B12) to (B14), the waveguide-based Mach-Zehnder interferometer comprises first and second interferometer-arm waveguides coupling between first and second waveguide beamsplitters. The method further includes changing an optical length of the first interferometer-arm waveguide.

(B16) In the method denoted (B15), said changing the optical length of the first interferometer-arm waveguide includes driving a microheater proximate to the first interferometer-arm waveguide to heat the first interferometer-arm waveguide.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A photonic integrated circuit, comprising:
   a first microresonator;
   a first bus waveguide that evanescently couples (a) pump light from the first bus waveguide into the first microresonator, and (b) signal light and idler light from the first microresonator into the first bus waveguide;
   a second bus waveguide; and
   a second microresonator that (i) resonantly couples unconverted pump light from the first bus waveguide to the second bus waveguide and (ii) non-resonantly couples each of the signal light and idler light from the first bus waveguide to the second bus waveguide.

2. The photonic integrated circuit of claim 1, wherein the first microresonator resonantly converts the pump light into the signal light and idler light.

3. The photonic integrated circuit of claim 1, wherein a length of the second microresonator is less than a length of the first microresonator.

4. The photonic integrated circuit of claim 1, wherein the first microresonator is fabricated from a material such that the first microresonator resonantly converts the pump light into the signal light and idler light via spontaneous four-wave mixing.

5. The photonic integrated circuit of claim 1, further comprising a nano-waveguide coupler optically interfacing with the first bus waveguide.

6. The photonic integrated circuit of claim 1, further comprising:
a local-oscillator waveguide; and
a waveguide-based Mach-Zehnder interferometer coupled with the local-oscillator waveguide, the first bus waveguide, a first interferometer output waveguide, and a second interferometer output waveguide.

7. The photonic integrated circuit of claim 6, further comprising:
a first nano-waveguide coupler optically interfacing with the first interferometer output waveguide; and
a second nano-waveguide coupler optically interfacing with the second interferometer output waveguide.

8. The photonic integrated circuit of claim 7, wherein:
the waveguide-based Mach-Zehnder interferometer comprises:
first and second waveguide beamsplitters; and
first and second interferometer-arm waveguides that couple between the first and second waveguide beamsplitters;
the local-oscillator waveguide and the first bus waveguide are coupled to the first waveguide beamsplitter; and
the first and second interferometer output waveguides are coupled to the second waveguide beamsplitter.

9. A method for generating squeezed light, comprising:
evanescently coupling pump light from a first bus waveguide into a first microresonator;
resonantly converting, within the first microresonator, the pump light into entangled signal light and idler light;
evanescently coupling the signal light and idler light from the first microresonator into the first bus waveguide;
resonantly coupling, with a second microresonator, unconverted pump light from the first bus waveguide into a second bus waveguide;
changing an optical length of the first microresonator such that one of a plurality of resonances of the first microresonator is resonant with the pump light; and
changing an optical length of the second microresonator such that (i) one of a plurality of resonances of the second microresonator is resonant with the pump light and (ii) none of the plurality of resonances of the second microresonator is resonant with the signal light or the idler light.

10. The method of claim 9, wherein the entangled signal light and idler light form a two-mode squeezed vacuum state.

11. The method of claim 9, further comprising coupling the signal light and idler light from the first bus waveguide into free space.

12. The method of claim 11, wherein said coupling uses a nano-waveguide coupler optically interfacing with the first bus waveguide.

13. The method of claim 9, further comprising changing a frequency of the pump light such that the pump light is resonant with one of a plurality of resonances of the first microresonator.

14. The method of claim 9, further comprising:
coupling the signal light and idler light from the first bus waveguide into a waveguide-based Mach-Zehnder interferometer;
coupling local-oscillator light into the waveguide-based Mach-Zehnder interferometer from a local-oscillator waveguide;
coupling first output light from the waveguide-based Mach-Zehnder interferometer into a first interferometer output waveguide; and
coupling second output light from the waveguide-based Mach-Zehnder interferometer into a second interferometer output waveguide.

15. The method of claim 14, the local-oscillator light being either monochromatic or bichromatic.

16. The method of claim 14, further comprising:
coupling the first output light from the first interferometer output waveguide into free space; and
coupling the second output light from the second interferometer output waveguide into free space.

17. The method of claim 16, wherein:
said coupling the first output light uses a first nano-waveguide coupler optically interfacing with the first interferometer output waveguide; and
said coupling the second output light uses a second nano-waveguide coupler optically interfacing with the second interferometer output waveguide.

18. The method of claim 14, wherein:
the waveguide-based Mach-Zehnder interferometer comprises first and second interferometer-arm waveguides coupling between first and second waveguide beamsplitters; and
the method further comprises changing an optical length of the first interferometer-arm waveguide.

19. A method for generating squeezed light, comprising:
evanescently coupling pump light from a first bus waveguide into a first microresonator;
resonantly converting, within the first microresonator, the pump light into entangled signal light and idler light;
evanescently coupling the signal light and idler light from the first microresonator into the first bus waveguide;
resonantly coupling, with a second microresonator, unconverted pump light from the first bus waveguide into a second bus waveguide;
coupling the signal light and idler light from the first bus waveguide into a waveguide-based Mach-Zehnder interferometer;
coupling local-oscillator light into the waveguide-based Mach-Zehnder interferometer from a local-oscillator waveguide;
coupling first output light from the waveguide-based Mach-Zehnder interferometer into a first interferometer output waveguide; and
coupling second output light from the waveguide-based Mach-Zehnder interferometer into a second interferometer output waveguide.

* * * * *